United States Patent
Fujita et al.

(10) Patent No.: US 7,635,851 B2
(45) Date of Patent: Dec. 22, 2009

(54) ELECTRON BEAM APPARATUS AND METHOD OF GENERATING AN ELECTRON BEAM IRRADIATION PATTERN

(75) Inventors: Ryo Fujita, Hitachi (JP); Haruo Yoda, Hinode (JP); Kimiaki Ando, Hamura (JP); Yuji Inoue, Hitachinaka (JP); Masato Muraki, Inagi (JP)

(73) Assignees: Hitachi High-Technologies Corporation, Tokyo (JP); Canon Inc., Tokyo (JP)

( * ) Notice: Subject to any disclaimer, the term of this patent is extended or adjusted under 35 U.S.C. 154(b) by 561 days.

(21) Appl. No.: 11/519,872

(22) Filed: Sep. 13, 2006

(65) Prior Publication Data

US 2007/0057200 A1      Mar. 15, 2007

(30) Foreign Application Priority Data

Sep. 13, 2005   (JP)   ............................. 2005-264699
Aug. 21, 2006   (JP)   ............................. 2006-224257

(51) Int. Cl.
    *H01J 37/08*   (2006.01)
(52) U.S. Cl. ................................. 250/492.22
(58) Field of Classification Search ............ 250/492.22, 250/398
    See application file for complete search history.

(56) References Cited

U.S. PATENT DOCUMENTS 6,541,784 B1    4/2003    Kawano et al.
6,870,171 B2    3/2005    Hosoda et al.
6,946,665 B2    9/2005    Muraki et al.
7,126,140 B2 *  10/2006   Yoda et al. ............. 250/492.22

FOREIGN PATENT DOCUMENTS

| JP | 05-308046 | 11/1993 |
|----|-----------|---------|
| JP | 08-213315 | 8/1996 |
| JP | 11-040485 | 2/1999 |
| JP | 11-195589 | 7/1999 |
| JP | 2000-508839 | 7/2000 |
| JP | 2002-118158 | 4/2002 |
| JP | 2004-063870 | 2/2004 |
| JP | 2004-200351 | 7/2004 |
| JP | 2005-032837 | 2/2005 |
| WO | WO 98/33197 | 7/1998 |

* cited by examiner

*Primary Examiner*—Kiet T Nguyen
(74) *Attorney, Agent, or Firm*—Antonelli, Terry, Stout & Kraus, LLP.

(57) ABSTRACT

High-contrast exposure is performed by use of a small dose of electron beams, a pattern is formed on a wafer with high accuracy, and high-precision inspection is performed. In pattern formation, proximity effect correction processing is performed. Moreover, exposure of electron beams is performed based on a result of filtering using an inverse characteristic of exposure characteristics of the electron beams. Furthermore, in pattern inspection, electron beams are irradiated based on a result of filtering for obtaining a peripheral region of an edge of the pattern formed.

6 Claims, 16 Drawing Sheets

ELECTRON BEAM APPARATUS AND METHOD OF GENERATING AN ELECTRON BEAM IRRADIATION PATTERN

CLAIM OF PRIORITY

The present application claims priority from Japanese applications JP 2005-264699 filed on Sep. 13, 2005, and JP 2006-224257 filed on Aug. 21, 2006 the contents of which are hereby incorporated by reference into this application.

BACKGROUND OF THE INVENTION

1. Field of the Invention

The present invention relates to an electron beam apparatus which irradiates a semiconductor substrate (hereinafter referred to as a wafer) or the like with finely focused electron beams. More particularly, the present invention relates to an electron beam apparatus which draws extremely-fine graphic patterns on the wafer, to an electron beam apparatus which inspects patterns drawn on the wafer by observing secondary electrons emitted from the wafer irradiated with electron beams, and to an electron beam apparatus having both drawing and inspecting functions using electron beams.

To be more specific, the present invention relates to an electron beam apparatus which subjects a graphic pattern to be drawn to inverse filtering to sharpen the graphic pattern for the purposes of enhancing the contrast of an exposed image and also speeding up drawing, and to a method of generating an electron beam irradiation pattern.

Moreover, the present invention relates to an electron beam apparatus which irradiates electron beams on a periphery of edges of a pattern to be inspected on a wafer, thereby preventing occurrence of electrostatic charges and improving inspection accuracy.

Furthermore, the present invention relates to an electron beam apparatus which realizes high-speed graphic pattern drawing and wafer inspection by irradiating a wafer with a plurality of electron beams.

2. Description of the Related Art

An electron beam apparatus which draws a graphic pattern on a wafer by use of electron beams is designed to form a desired drawing pattern on a wafer by irradiating electron beams of a given shape onto a wafer coated with a photosensitive material (hereinafter referred to as a resist) which is photosensitive to electron beams, and then by removing the resist, which has been changed in quality due to exposure, by use of chemicals. Conventional electron beam apparatuses include a variable-shaped beam writer, as disclosed in Japanese Patent Application Publication No. Hei 11 (1999)-40485, which passes electron beams through several apertures to form the electron beams of a given shape, and which then exposes a given pattern onto a resist on a wafer. The variable-shaped beam writer is now in wide use. Moreover, in Japanese Patent Application Publication No. Hei 11 (1999)-195589 and Japanese Patent Application Publication No. 2000-508839, a raster scan type electron beam apparatus is disclosed, which uses finely focused spot electron beams to form and expose a pattern of a given shape on a wafer. The raster scan type electron beam apparatus will probably come into wider use in the future as a process will become finer.

It is known that, in the electron beam apparatuses described above, an error arises in a pattern to be exposed, due to a phenomenon called a proximity effect of electron beams even if electron beam is irradiated thereon by using the desired drawing pattern to be drawn. The finer patterns to be exposed are, the greater errors relatively become. Thus causing a significant problem. The proximity effect is a phenomenon in which electron beams, which have reached a wafer, not only expose a resist but also pass through the resist, then scatter inside the wafer, and thus expose the resist again. Although the absolute amount of the electrons is small, the range of scattering reaches a few tens of micrometers ($\mu$m). When electron beams are irradiated over a wide range, the amount of exposure reaches a few tens of percent (%) of the threshold of exposure that is the exposure level of the resist. Thus, the proximity effect causes overexposure also outside a portion originally irradiated with the electron beams. As a result, the exposed pattern does not match an electron beam irradiation pattern.

As a method for improving the accuracy of drawing a pattern taking the proximity effect mentioned above into consideration, there is a method including the steps of: previously determining density of a pattern to be drawn; smoothing the determined density, thereby calculating the amount of overexposure due to the proximity effect; and suppressing the dose of electron beams to be applied to a portion to be overexposed, based on the calculated amount of overexposure, as disclosed in, for example, Japanese Patent Application Publication Nos. Hei 8 (1996)-213315 and Hei 5 (1993)-308046 and the above publication No. 2000-508839.

On the other hand, an electron beam apparatus, in which a wafer or the like is irradiated with finely focused electron beams so as to observe secondary electrons emitted from the wafer, can inspect a graphic pattern drawn on the wafer by utilizing the fact that the amount of secondary electrons varies depending on the inclination of the surface of the wafer. Such electron beam apparatuses include an apparatus disclosed in Japanese Patent Application Publication No. Hei 9 (1997)-166428, showing a method for performing high-precision measurement by extrapolating the effect of electrostatic charge or the like due to electron beam irradiation and variations in measured dimensions.

Moreover, Japanese Patent Application Publication Nos. 2003-257355 and 2003-346698, for example, disclose a multiple-beam type electron beam apparatus which simultaneously irradiates a sample such as a wafer with a plurality of electron beams, thus performing high-speed observation on the sample.

[Patent Literature 1] Japanese Patent Application Publication No. Hei 11 (1999)-40485

[Patent Literature 2] Japanese Patent Application Publication No. Hei 11 (1999)-195589

[Patent Literature 3] Japanese Patent Application Publication No. 2000-508839

[Patent Literature 4] Japanese Patent Application Publication No. Hei 8 (1996)-213315

[Patent Literature 5] Japanese Patent Application Publication No. Hei 5 (1993)-308046

[Patent Literature 6] Japanese Patent Application Publication No. Hei 9 (1997)-166428

[Patent Literature 7] Japanese Patent Application Publication No. 2003-257355

[Patent Literature 8] Japanese Patent Application Publication No. 2003-346698

SUMMARY OF THE INVENTION

A first problem to be solved by the present invention is to speed up drawing as well as to improve the accuracy of the drawing by correcting the proximity effect occurred in an electron beam apparatus which draws a graphic pattern on a wafer by use of electron beams. In any of the above conventional methods for correcting the proximity effect, since the dose of electron beams, which are applied to a portion having a high pattern density, is suppressed, the contrast of a pattern to be exposed is also suppressed. This causes the loss of linearity of the edge portion of the pattern, thus leading to deterioration in the accuracy of drawing the pattern, unless exposure sensitivity of a resist is changed. According to the method disclosed in Japanese Patent Application Publication No. Hei 8 (1996)-213315, since the dose of electron beams to be applied is not much suppressed regarding a portion having a low pattern density, a high-contrast exposed pattern may be achieved. However, the absolute value of the amount of electron beams is large. This leads to an increase in time for electron beam irradiation and hence results in a trade-off between system throughput and the accuracy of drawing a pattern.

Meanwhile, for accurately drawing a minute pattern, deterioration in contrast of the pattern due to blur of electron beams per se is also a problem. In case of using the above raster scan type electron beam apparatus similar to the present invention, it may be considered to adopt the approach of subjecting an image to high-pass filtering known as a general approach for enhancing the contrast of the image, because the apparatus is designed to form an exposed image by controlling the time for electron beam irradiation, using, as pixels, spot electron beams, which are finely focused, to be irradiated onto a wafer. Application of this approach to an electron beam irradiation pattern can be expected to achieve an improvement in the contrast of a resultant exposed image. However, generally, an impulse response of the high-pass filter contains a negative component, and therefore a resultant image, even after undergoing the filtering, has a negative value. This corresponds to a so-called undershoot of a pulse signal. Thus, higher filter intensity leads to a larger negative component. Since the intensity of electron beam irradiation is normally controlled by controlling the time for electron beam irradiation, the intensity thereof is assigned only a positive value. For the purpose of only enhancing the contrast of a resultant exposed image, it is effective to merely round a negative component of the resultant image to zero for generating a so-called overshoot after undergoing the high-pass filtering. However, the rounding of the negative component results in the problem of causing overexposure performed and thus making it impossible to achieve expected accuracy.

A first object of the present invention is therefore to improve a throughput by reducing the time for electron beam irradiation as well as to achieve the high-accuracy drawing of a pattern by improving the contrast of an exposed image.

A second problem to be solved by the present invention pertains to an electron beam apparatus which irradiates a wafer or the like with electron beams to observe secondary electrons emitted from the wafer. Specifically, the second problem is to improve inspection accuracy by reducing the occurrences of electrostatic charge, heat generation, and contamination, which are factors responsible for deterioration in the inspection accuracy. The electron beam apparatus cannot avoid electrostatic charge because the apparatus performs electron beam irradiation. However, the ability to reduce the occurrence of a "negative charge" which causes the state of a potential distribution on the surface of a sample to be unstable, as described in Japanese Patent Application Publication No. Hei 9 (1997)-166428, makes it possible to lessen the effect of electrostatic charge and hence improve the accuracy.

A second object of the present invention is therefore to improve the inspection accuracy of the electron beam apparatus by reducing the occurrence of the negative charge.

Moreover, a third problem to be solved by the present invention pertains to a multiple-beam type electron beam apparatus which simultaneously irradiates a plurality of electron beams to observe emitted secondary electrons. Specifically, the third problem is to facilitate construction of the apparatus even by use of a single column (or lens-barrel), and to realize a function of drawing a graphic pattern on a wafer by use of an integral electron beam apparatus. The multiple-beam type electron beam apparatuses disclosed in the above patent literatures 7 and 8 are of a type using a plurality of columns, and thus cannot be integrated with an electron beam apparatus which uses a single column to irradiate a wafer with a plurality of electron beams to draw a graphic pattern on the wafer. In case of irradiating a plurality of electron beams with a single column, the electron beams are spaced apart at intervals of a few micrometers to a few tens of micrometers. Therefore, it is difficult for separate detectors spaced apart at intervals of a few centimeters to independently receive secondary electrons emitted respectively.

A third object of the present invention is therefore to construct an electron beam apparatus which uses a single column to irradiate a plurality of electron beams to observe secondary electrons emitted, and to integrate into the apparatus the function of drawing a graphic pattern on a wafer.

The solution to the aforementioned first problem is to increase the dose of electron beams which corresponds to a pattern to be drawn in an area having a low pattern density, and, on the contrary, to reduce the amount in an area having a high pattern density, thus adding an additive exposure component to the dose. Then, a high-pass filtering is performed on the dose of the electron beams, which has been added the additive exposure component, so as not to make the dose of electron beams negative. More specifically, in the correction of the proximity effect, the dose of electron beams is corrected so as to offset the amount of overexposure caused by the proximity effect. In addition, the strength of the filter is adjusted using information about the pattern density such that the result obtained by filtering does not become negative. As the filter, used is an "inverse filter" having an inverse characteristic of the energy distribution of the electron beams, that is, an inverse characteristic of the distribution of the exposure amount exposed using finely focused electron beams, actually, having an approximation property thereof. Accordingly, highly accurate exposure can be realized.

The solution to the aforementioned second problem is to extract the edge portion of the graphic pattern drawn on the wafer with reference to graphic data information thereof and to irradiate a large amount of electron beams on a periphery of the edge portion. More specifically, the graphic data is converted to a bit map, and a differentiation filtering and a Gaussian filtering are performed on the bit map. A large amount of electron beams are then irradiated in the area where the edge of the graphic pattern exists, and a small amount of electron beams are irradiated in the area where the edge of the graphic pattern does not exist. Since fewer electron beams are irradiated in flat areas having no edge, negative charge can be suppressed.

The solution to the foregoing third problem is to provide an image inspection processor to the apparatus, which processes multiple images formed on a wafer in a multiplex manner by using detectors to take in all secondary electrons corresponding to a plurality of electron beams. For example, when four electron beams arranged in a lattice pattern at intervals of 32 µm are used, an image to be obtained by one detector is an image formed by superimposing four images placed at the intervals of 32 µm onto each other. Based on the fact that the obtained image is formed of multiple images superimposed at the intervals of the electron beams, image processing is performed. Thus, it is enabled to perform image inspection processing, such as brightness adjustment, focus control, pattern matching of images, and length measurement.

The present invention makes it possible to reduce the maximum dose of electron beams in comparison to the proximity effect correction method disclosed in patent literature 4 for controlling the dose of electron beams to be larger in the area where the pattern to be drawn has a low density and to be smaller in the area where the pattern to be drawn has a high density. Thus, system throughput can be improved. Moreover, the present invention can improve the slope of the exposure amount at the edge portion of the pattern, i.e., the contrast of the image by 20 to 30% in comparison to the method disclosed in patent literature 5 for offsetting the dose of electron beams so as to cancel the proximity effect in the area where the pattern to be drawn has a low density.

In using the multiple-beam type electron beam apparatus having a plurality of electron beams to significantly improve the throughput, many hardware resources can be shared, such as a drawing pattern to be drawn, the pattern density, a filter coefficient and a line buffer for filtering, without adding any pieces of hardware corresponding to the number of electron beams. Thus, application of multiple beams can be realized with little hardware.

Moreover, according to the present invention, in the electron beam apparatus which irradiates a wafer or the like with electron beams to observe secondary electrons emitted from the wafer, a large amount of electron beams can be irradiated a periphery of the edge portion of the pattern while a small amount of electron beams can be irradiated in the area including no edge portion. Therefore, negative charge can be suppressed in the area including no edge portion, and contamination and heat generation are suppressed. Thus, inspection accuracy can be improved.

Furthermore, according to the present invention, a plurality of electron beams are simultaneously irradiated on a sample such as a wafer, and secondary electrons emitted from the wafer are collectively processed to inspect an image. Thus, high-speed inspection can be performed as many times as the number of electron beams. Moreover, the structure can be set the same as that of the electron beam apparatus which irradiates a wafer with electron beams to draw a graphic pattern on the wafer. Therefore, functions of drawing a graphic pattern and of inspecting the drawn graphic pattern are realized by use of the same column. Thus, the costs can be reduced.

DETAILED DESCRIPTION OF THE INVENTION

Embodiments of the present invention will be described below with reference to the drawings.

Figure 1:
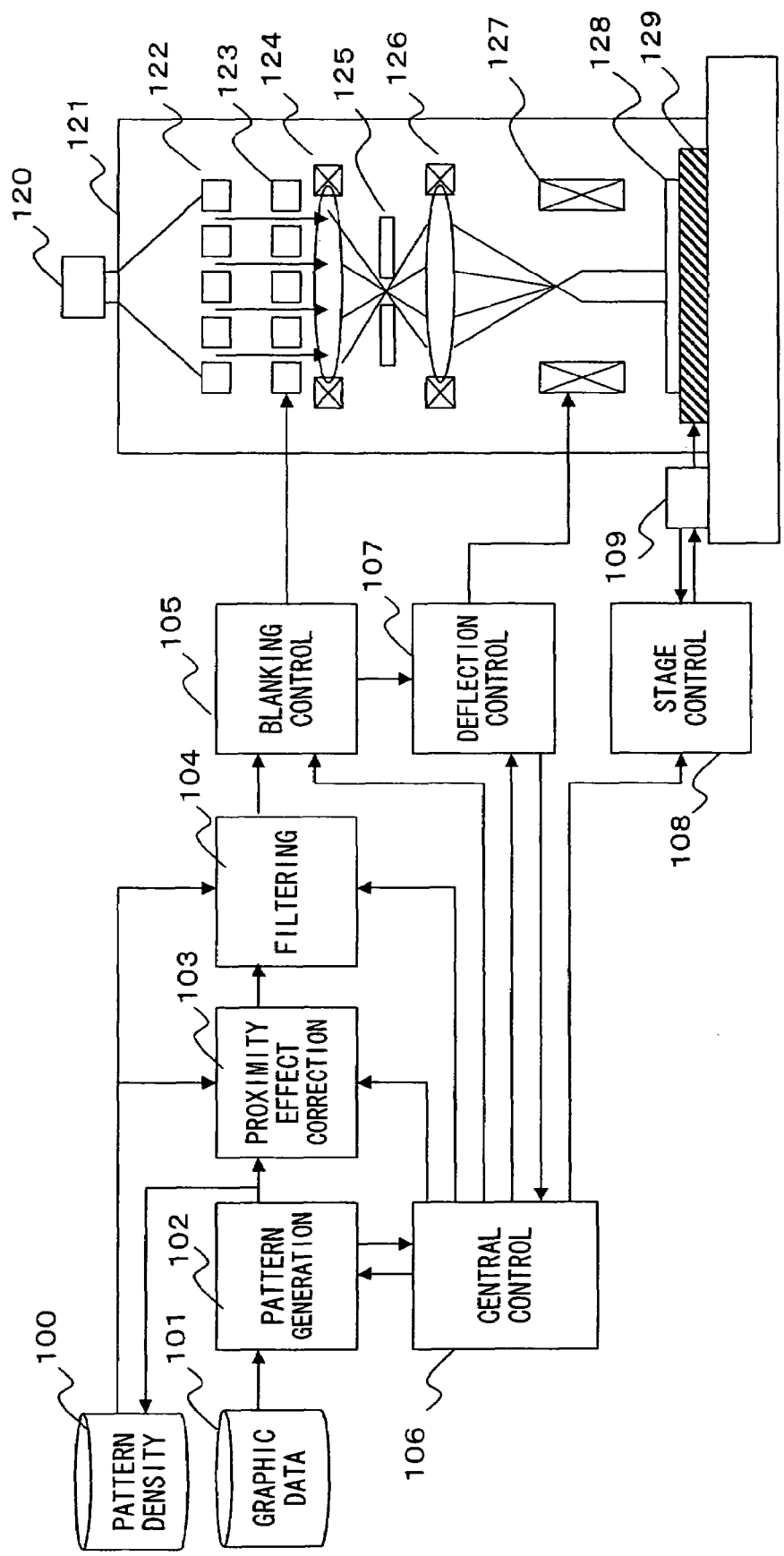
FIG. 1 is a block diagram showing an entire configuration of an electron beam apparatus according to a first embodiment.

FIG. 1 is a block diagram showing an example of an overall configuration of an electron beam apparatus which irradiates a wafer with electron beams to draw a graphic pattern on the wafer, according to a first embodiment of the present invention.

The electron beam apparatus includes a column 121 which irradiates a resist-coated wafer 128 with an electron beam emitted by an electron gun 120 in a vacuum. The column 121 is provided therein with the electron gun 120, apertures 122, a blanker 123, an electron lens 124, a plate 125, an electron lens 126, a deflector 127, and a stage 129. The electron gun 120 emits an electron beam. The apertures 122 form the electron beams into a plurality of finely focused spot electron beams. The blanker 123 controls the determination of whether the plurality of electron beams should travel straight or should be deflected depending on a signal sent from a blanking control section 105. The electron lens 124 focuses the electron beams which have passed through the blanker 123. The plate 125 is provided with small holes which allow only the electron beams traveling straight through the blanker 123 to pass and do not allow the electron beams deflected by the blanker 123 to pass. The electron lens 126 focuses the electron beams onto the wafer 128 to form an image thereon. The deflector 127 deflects the electron beams onto the wafer 128 toward a given position thereon within a given range under the control of a deflection control section 107. The stage 129 supports the wafer 128 thereon.

A graphic data storage section 101 stores graphics, such as rectangles and polygons, which represent a prepared integrated circuit pattern to be drawn, and information on the position and size of the pattern on the wafer 128. A pattern generation section 102 converts graphic data inputted from the graphic data storage section 101 into bit map pattern data using, as a pixel value, the amount of electron beams to be irradiated to each of lattice points into which the wafer 128 is divided in a lattice form. A pattern density storage section 100 stores as a pattern density the sum of pixel values of the pattern within each of predetermined regions on the wafer 128 into which the wafer 128 is divided. A proximity effect correction section 103 performs correction on the pattern data, based on the pattern data and the pattern density, so as to offset exposure components by excessive electron beans due to back-scatter. A filtering section 104 subjects the pattern data to filtering using a filter having an inverse characteristic to exposure characteristics of the electron beams, based on the pattern data, which is corrected by the proximity effect correction section 103, and the pattern density, so as to prevent a negative value from being generated. The blanking control section 105 buffers the pattern data, which have been subjected to the inverse filtering by the filtering section 104, and controls the blanker 123 so that the electron beams pass through the blanker 123 within a time period indicated by the pixel value of the pattern data. A central control section 106 initializes the overall system, sets parameters, and issues operation commands. The deflection control section 107 controls the deflector 127 so that the electron beam emitted by the electron gun 120 is irradiated at a predetermined position within a given range of the wafer 128. A stage control section 108 controls an actuator which actuates the stage 129 and a position sensor 109 so that the electron beam is emitted by the electron gun 120 is irradiated onto a predetermined position of the wafer 128.

Figure 2:
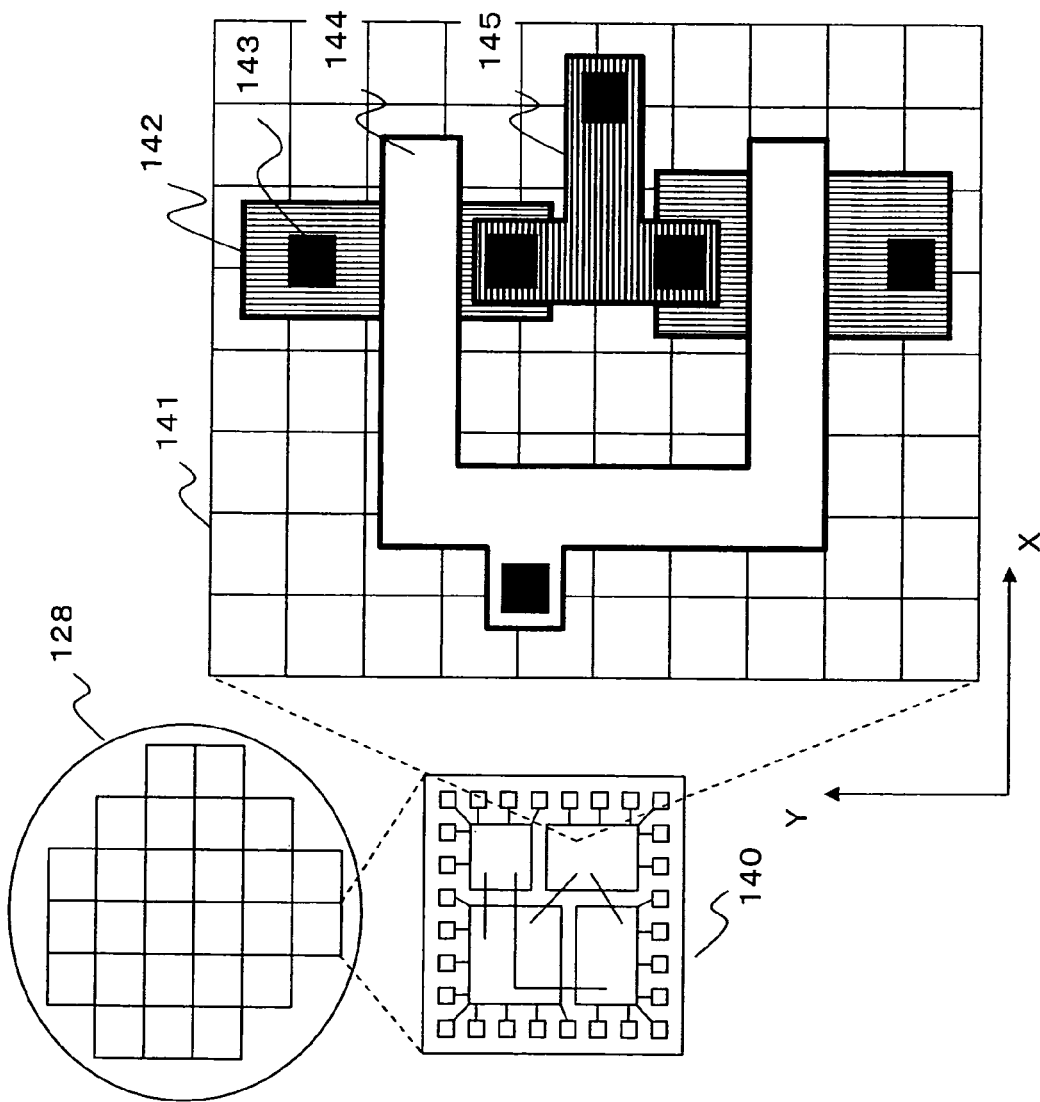
FIG. 2 is a view showing a relationship among a wafer, an integrated circuit and graphic data.

Next, with reference to FIG. 2, description will be given of the graphic data stored in the graphic data storage section 101. The wafer 128 is made of, for example, a silicon substrate having a diameter of 300 mm, and plural types of integrated circuits 140 are formed thereon. The integrated circuit is formed of unit cells 141 such as an AND element and a flip-flop, and wiring which provides interconnections between the unit cells 141. Looking at the unit cells 141 in more detail, in case of the typical CMOS, graphics such as a diffused layer 142, a contact layer 143, a polysilicon layer 144 and a metal wiring layer 145 are disposed on the unit cell 141. The graphic data storage section 101 defines and stores the graphic types and vertex coordinates of the graphic data as described above for each layer.

Figure 3:
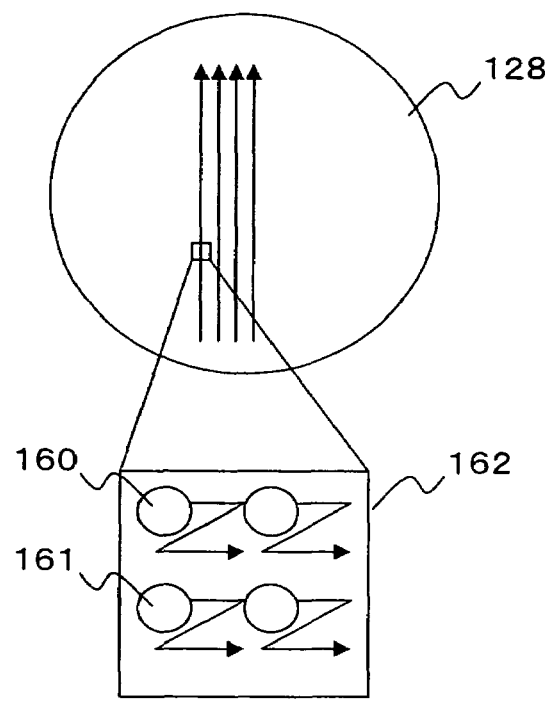
FIG. 3 is a view showing a relationship between the wafer and movement of electron beams.

On the other hand, as shown in FIG. 3, a plurality of electron beams 160, 161, . . . which are generated from the electron gun 120 reach the wafer 128 after passing through the blanker 123, the electron lens 126 and the like. In this event, as shown in FIG. 3, the stage control section 108 controls the wafer 128 to move for a long distance, and the movement of the electron beams 160, 161, . . . is controlled by the deflection control section 107. Accordingly, the electron beams can be irradiated onto the entire surface of the wafer. Reference numeral 162 in FIG. 3 denotes a fine scanning range of the electron beams.

Figure 4:
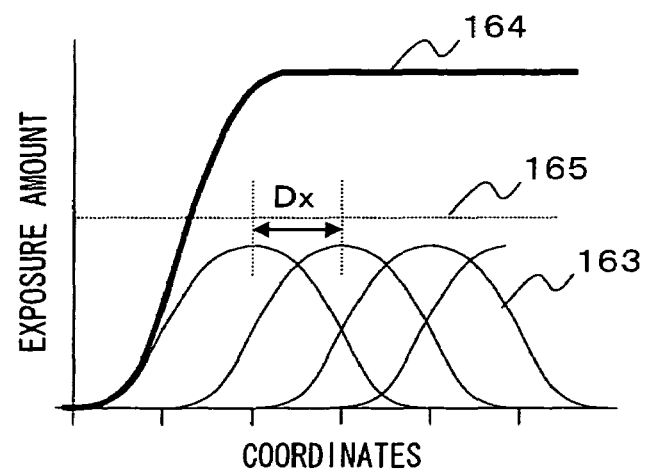
FIG. 4 is a graph showing a relationship between electron beams to be irradiated and an exposure amount.

The electron beams 160, 161, . . . are spaced apart at intervals of several micrometers to several tens of micrometers. Each of the electron beams is irradiated onto the wafer 128 at a fine interval Dx as shown in FIG. 4. A plurality of distributions 163 of the amount of exposure by one electron beam are overlapped to make a total amount of exposure 164. Thus, a pattern is formed beyond an exposure threshold 165 that is a photosensitive level of the resist.

As described above, the electron beams are irradiated at the fine interval Dx. Thus, the aforementioned graphic data is expanded in the pixels arranged on the lattice spaced at the interval Dx by the pattern generation section 102. Accordingly, an electron beam irradiation pattern can be generated. To be more specific, the graphic defined by the graphic data takes on, as its pixel value, a graphic amount included in a minute plane of Dx×Dx in which pixels are arranged at the interval Dx on the coordinate system of the wafer 128. For example, the graphic amount takes on a value of 1.0 if the pixels are inside the graphic, takes on a value of 0.0 if the pixels are outside the graphic, and takes on a value of 0.0 to 1.0 depending on an area by which the graphic is included in the pixels if the pixels are on the boundary of the graphic. Meanwhile, the pattern generation section 102 has a function of generating pattern data based on such graphic data and of calculating a pattern density value obtained by accumulating the pixel values in a given region. Here, the given region is, for example, a square having several micrometers on a side, or a square having several tens of pixels on a side, as long as the influence of back-scatter to be described later can be identified. The pattern density value is stored in the pattern density storage section 100 and is used by the proximity effect correction section 103 and the filtering section 104.

Figure 5:
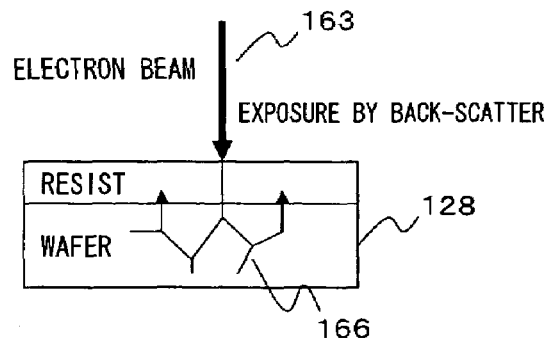
FIG. 5 is a view explaining back-scattering caused by electron beams irradiated onto the wafer.

Before description is given of the proximity effect correction section 103 and the filtering section 104, the proximity effect correction will be described. FIG. 5 is a view showing a proximity effect caused by back-scatter of electron beams. When irradiated onto the resist-coated wafer 128, the electron beam 163 exposes the resist and scatters inside the wafer. Moreover, a back-scatter component 166 reexposes the resist.

Figure 7:
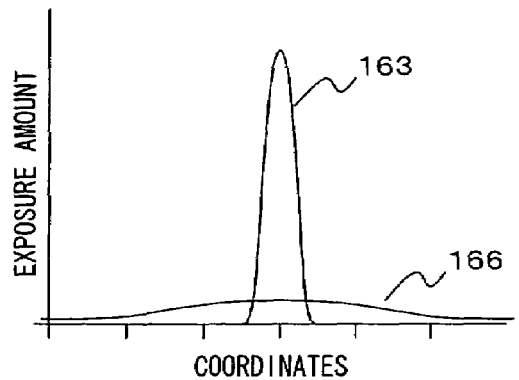
FIG. 7 is a graph showing a distribution of the exposure amount by electron beam irradiation.

FIG. 7 shows a distribution of the exposure described above. The exposure having a half-value width of several tens of nanometers, which is directly carried out by the electron beam 163, and the exposure having a half-value width of several tens of micrometers, which is carried out by the back-scatter component 166, are carried out while overlapping with each other. The above exposure is carried out at the interval of Dx as shown in FIG. 4. Thus, in an area where a dose is large and thus the pattern density is high, the exposure by the back-scatter component 166 is accumulated, and therefore excessive exposure is carried out. Accordingly, compared with the case where there is no back-scatter, a spot that exceeds the exposure threshold is shifted for the increased exposure. This is a phenomenon called the proximity effect, which has become a significant problem in the electron beam apparatus.

Figure 8:
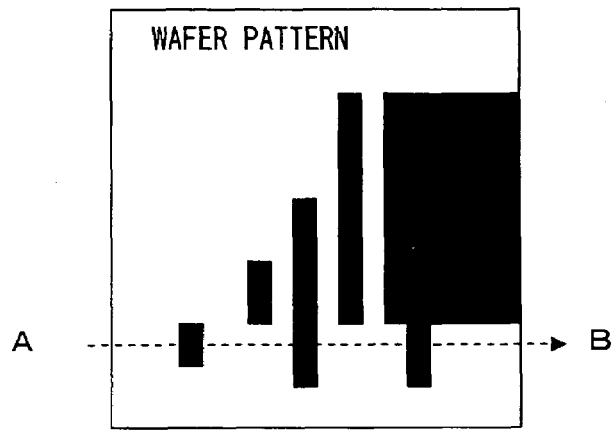
FIG. 8 is a view showing an example of a pattern to be drawn, which is used in description of the embodiment.
Figure 9:
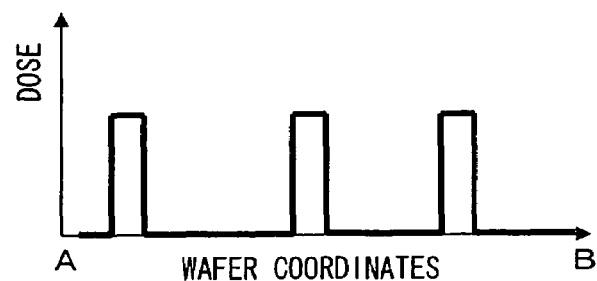
FIGS. 9A to 9C are graphs showing a relationship between a dose of electron beams and an exposure amount in the case of performing no proximity effect correction.
Figure 9:
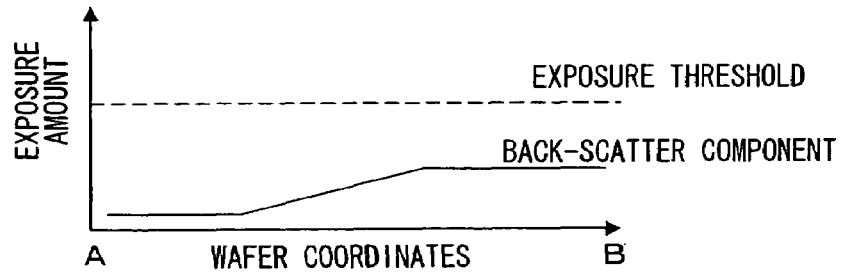
Figure 9:
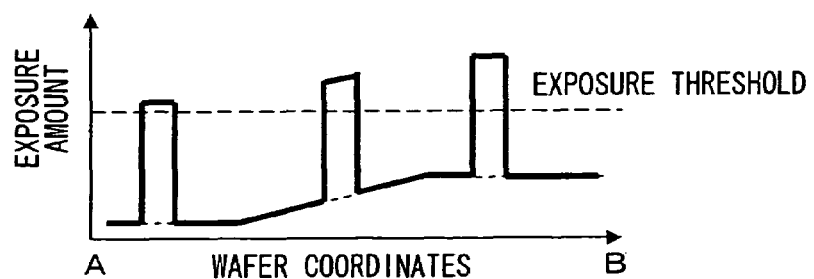

For example, FIGS. 9A to 9C show a state of a line connecting points A and B in the case where a pattern as shown in FIG. 8 is exposed. As to a dose of electron beams, when a given dose of irradiation is performed in a portion having a graphic of a pattern as shown in FIG. 9A, exposure is performed by a back-scatter component as shown in FIG. 9B under the influence of electron beam irradiation onto the pattern on the point B in a portion close to the point B. Thus, an exposure result as shown in FIG. 9C is obtained. As shown in FIG. 9C, between a portion close to the point A where the pattern density is low and a portion close to the point B where the pattern density is high, an exposure level that intersects with the exposure threshold in an edge portion of the pattern varies. The edge portion actually has a shallow curve as shown in FIG. 4. Thus, the pattern is exposed narrowly in the portion close to the point A and widely in the portion close to the point B.

Figure 10:
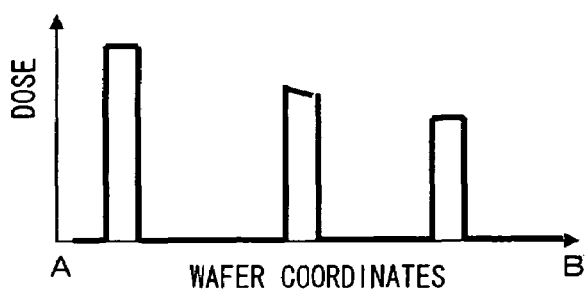
FIGS. 10A and 10B are graphs explaining a first conventional method for performing the proximity effect correction.
Figure 10:
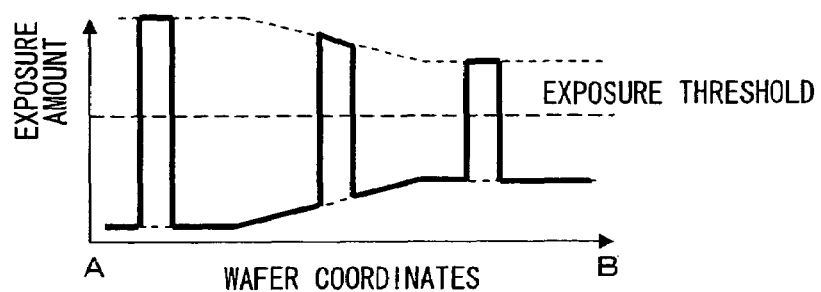

As a solution to the above problem, the following method is adopted. Specifically, for example, as shown in FIG. 10A, the dose of electron beams is set large in the portion where the pattern density is low, and the dose of electron beams is set small in the portion where the pattern density is high. As a result of the exposure, as shown in FIG. 10B, a mean value between an exposure amount of the portion where the pattern is present and an exposure amount of the portion where the pattern is not present becomes equal to the exposure threshold.

Figure 11:
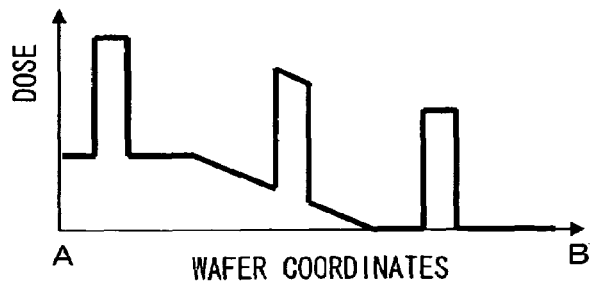
FIGS. 11A and 11B are graphs explaining a second conventional method for performing the proximity effect correction.
Figure 11:
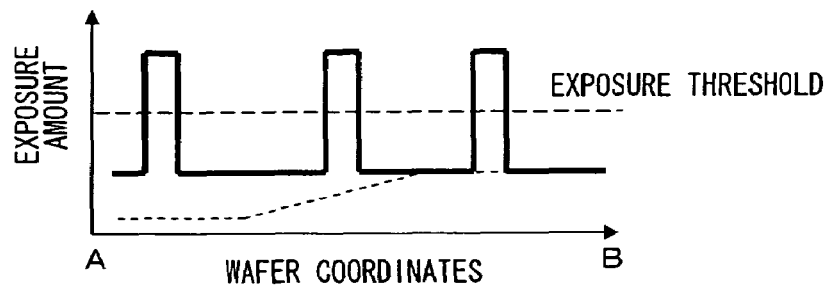

Moreover, as another solution, the following method is adopted. Specifically, as shown in FIG. 11A, electron beam irradiation is additionally performed in such a manner that electron beams are irradiated in the portion where the pattern density is high by a certain dose such that a mean value between an exposure amount of the portion where the pattern is present and an exposure amount of the portion where the pattern is not present, and electron beams are irradiated so as to offset the back-scatter component in the portion where the pattern density is low. Thus, as shown in FIG. 11B, in any portion of the wafer, the exposure threshold is set at the intermediate level between the exposure amounts of the portions where the pattern is present and not present.

Figure 6:
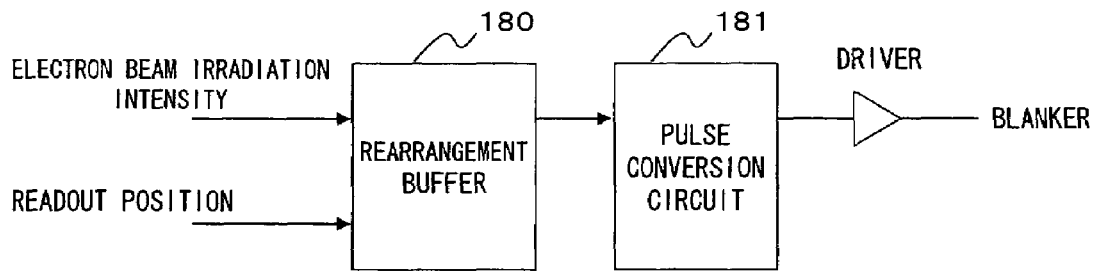
FIG. 6 is a block diagram showing a configuration of a blanking controller.

Compared with the method shown in FIGS. 11A and 11B of performing additional electron beam irradiation, the method shown in FIGS. 10A and 10B of increasing the dose of electron beams in the portion where the pattern density is low has problems, such that more time is required for electron beam irradiation and that system throughput is lowered. The dose of electron beams is controlled in the following manner. Specifically, as shown in FIG. 6, pixel values, which are indicated by electron beam irradiation intensity provided by the filtering section 104, are rearranged so as to become an input to the blanker 123, and the rearranged values are buffered by a buffer 180. Thereafter, based on a pixel value at a readout position provided by the central control section 106, the values are converted into time required for electron beam irradiation by a pulse conversion circuit 181. Subsequently, a pulse signal of the converted time is sent to the blanker 123. For example, in the case where the maximum irradiation time is set at 10 nanoseconds and a pixel value is expressed by 8 bits, a potential difference is applied to the blanker 123 so as to prevent the electron beams for passing during 10×(256−N)/256 nanoseconds. The maximum irradiation time is a maximum dose of electron beams. The smaller the dose is, the more the system throughput can be reduced.

Meanwhile, compared with the method shown in FIGS. 10A and 10B of increasing the dose of electron beams in the portion where the pattern density is low, the method shown in FIGS. 11A and 11B of performing additional electron beam irradiation has a problem that the exposure accuracy is lowered because of a smaller change in the exposure amount in the edge portion of the pattern, particularly, in the portion where the pattern density is low. The exposure threshold of the resist has a certain range and the steeper change in the exposure amount that intersects with the exposure threshold value enables more highly accurate exposure.

Figure 12:
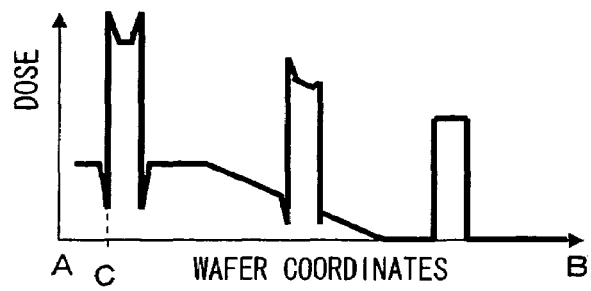
FIGS. 12A to 12C are graphs explaining a dose of electron beams subjected to filtering, and an effect thereof.
Figure 12:
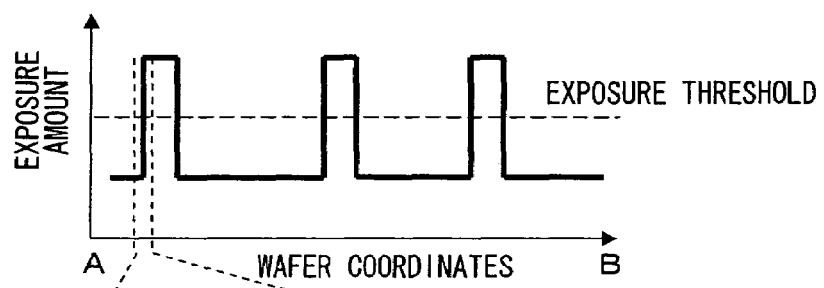
Figure 12:
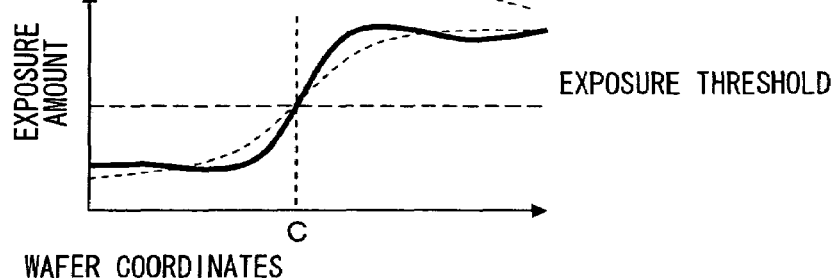

With reference to FIGS. 12A to 12C, a filtering method for sharpening intensity which is dependent on the pattern density will be described, the method being one of the features of the present invention. FIG. 12A shows an example of an electron beam irradiation pattern obtained by further applying a filter such as a two-dimensional high-pass filter on the additive electron beam irradiation pattern shown in FIG. 11. Specifically, the lower the pattern density is, the more intense the filter to be provided is. By providing the filter, an undershoot and an overshoot can be added to an edge portion of a pattern as indicated by a point C in FIG. 12C. Moreover, by changing the intensity of the filter depending on the pattern density, occurrence of a negative dose of electron beams can be prevented. As described above, the dose of electron beams is controlled by the duration for which the pulse signal is given to the blanker 123, and thus a negative component cannot be applied thereto. In the case where the negative component is generated, rounding the negative component to zero is a typically conceivable and easy method. However, a position of a pattern to be exposed is shifted. By using the method of the present invention, the above problem can be prevented from occurring. The exposure amount is, as shown in FIG. 12B, the same as that of the method shown in FIG. 11 of additionally performing electron beam irradiation. However, Taking a closer look at the point C, as shown in FIG. 12C, the exposure amount becomes sharply changed in the edge portion of the pattern due to the effects of the undershoot and the overshoot.

Figure 13:
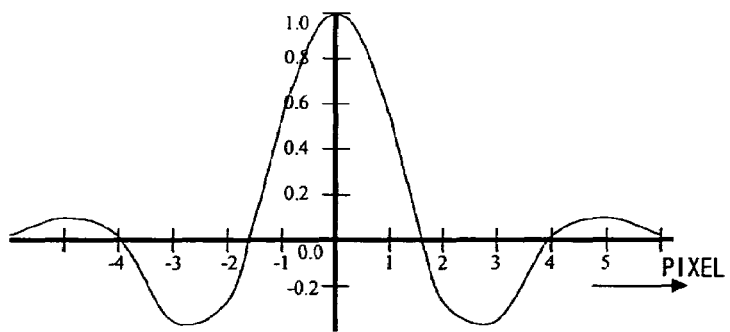
FIG. 13 is a graph showing a one-dimensional inverse characteristic obtained from exposure distribution characteristics of electron beams.
Figure 14:
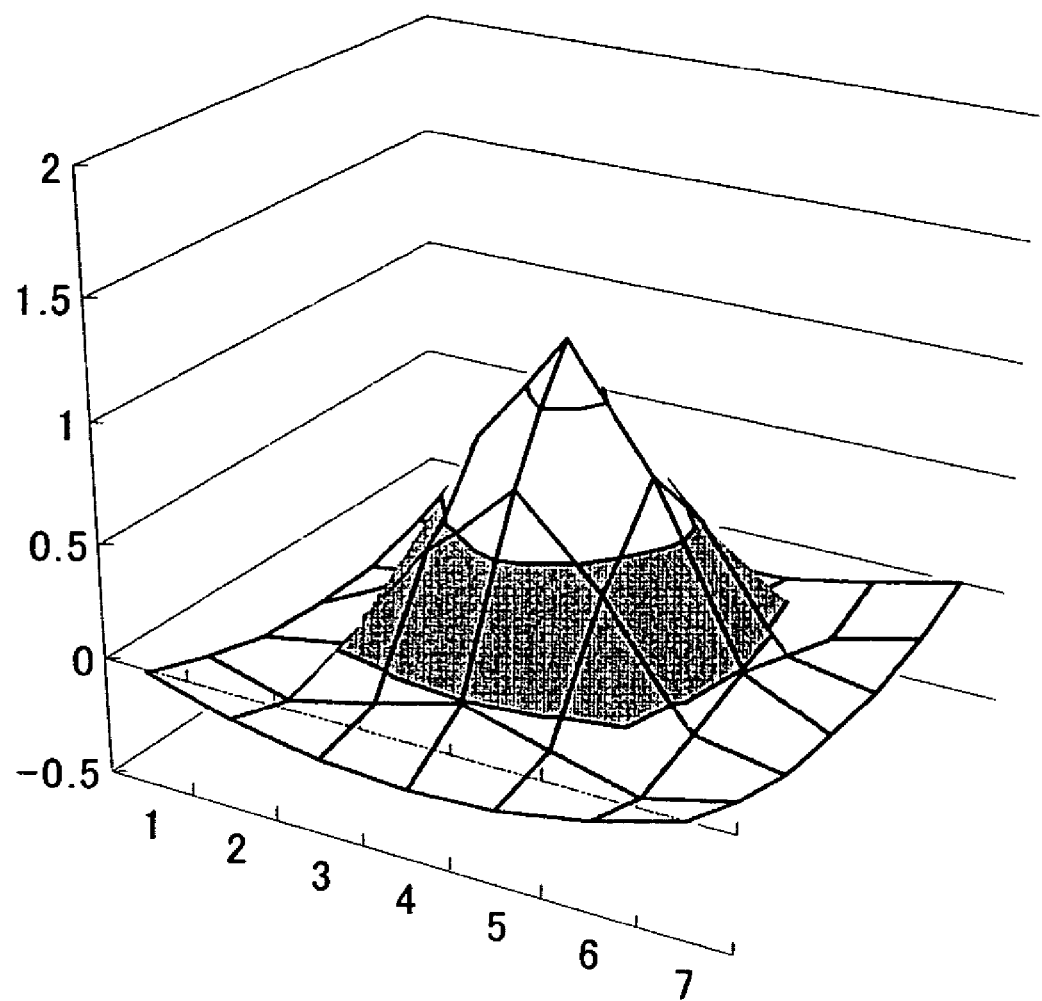
FIG. 14 is a graph showing a two-dimensional inverse characteristic obtained from the exposure distribution characteristics of the electron beams.

The amount of change in the exposure amount in the edge portion of the pattern as shown in FIG. 4 is originally determined by the exposure distribution 163 of electron beams. If it is possible to use, as the above-described filter, a filter having an inverse characteristic to the exposure distribution 163 of electron beams, a pattern generated by the pattern generation section 102, which is obtained by expanding the graphic data, can be ideally restored. However, it is known that the exposure distribution 163 of electron beams can be roughly approximated to a Gaussian distribution. Therefore, as to frequency characteristics of the Gaussian distribution, inverse characteristics thereof cannot be generally obtained. Specifically, if the frequency is higher, the frequency characteristics thereof become closer to 0. Therefore, the inverse characteristics thereof are dispersed. Thus, there has been known means called a Wiener-Hopf filter for obtaining an approximation property of the inverse characteristic. By using the Wiener-Hopf filter, an approximation property of the inverse characteristic can be obtained simply by multiplying $|H(\omega)|^2/(|H(\omega)|^2+\epsilon^2)$ by $1/H(\omega)$ when the frequency characteristics are set at $H(\omega)$. By further subjecting the resultant obtained to inverse Fourier transform, filter characteristics can be obtained. FIG. 13 shows an example where a maximum value obtained by using a one-dimensional filter is normalized to 1. Similarly, FIG. 14 shows an example where a two-dimensional filter is used.

Figure 15:
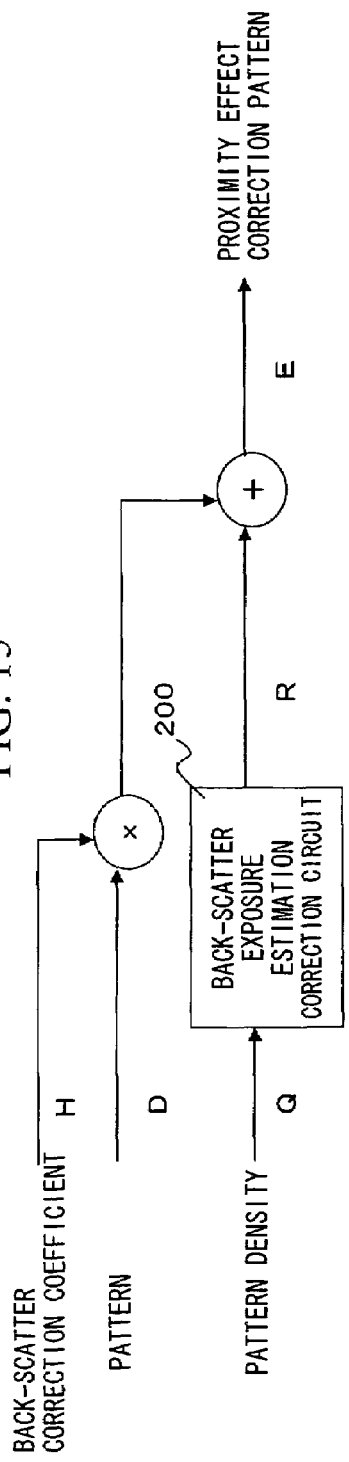
FIG. 15 is a block diagram showing a configuration of a proximity effect correction section.

Next, the proximity effect correction section 103 and the filtering section 104 will be described in detail, which realize a method of filtering at intensity dependent on the pattern density described above. FIG. 15 shows a configuration of the proximity effect correction section 103. A back-scatter correction coefficient H is a constant value given by the central control section 106, which indicates a difference in the dose of electron beams between the portions where the pattern is present and not present. The back-scatter correction coefficient H is uniquely determined by a ratio thereof to characteristics of the resist and a dose of the back-scatter. A pattern D is generated by the pattern generation section 102 and takes on a value of 0 to 1 depending on the proportion of the graphic to the pixel as described above. A pattern density Q is given by the pattern density storage section 100 and is a pattern density of a region corresponding to the pixel or one obtained by smoothing the pattern density. Based on the pattern density Q, an additive dose R of electron beams such as to offset back-scatter exposure amount is obtained by use of a back-scatter exposure estimation correction circuit 200. The back-scatter exposure estimation correction circuit 200 obtains a back-scatter component due to excessive exposure shown in FIG. 9 based on the pattern density, and performs correction so as to offset the back-scatter component. In this embodiment, the above circuit is realized by utilizing a look-up table using a memory. As to a method of obtaining a back-scatter component due to excessive exposure based on the pattern density, since details thereof are described in many literatures such as the aforementioned patent literature 2, description thereof will be omitted here. A proximity effect corrected pattern E that is an output of the proximity effect correction section 103 is obtained by adding the dose R of electron beams to be added to a product of the pattern D and the back-scatter correction coefficient H.

Figure 16:
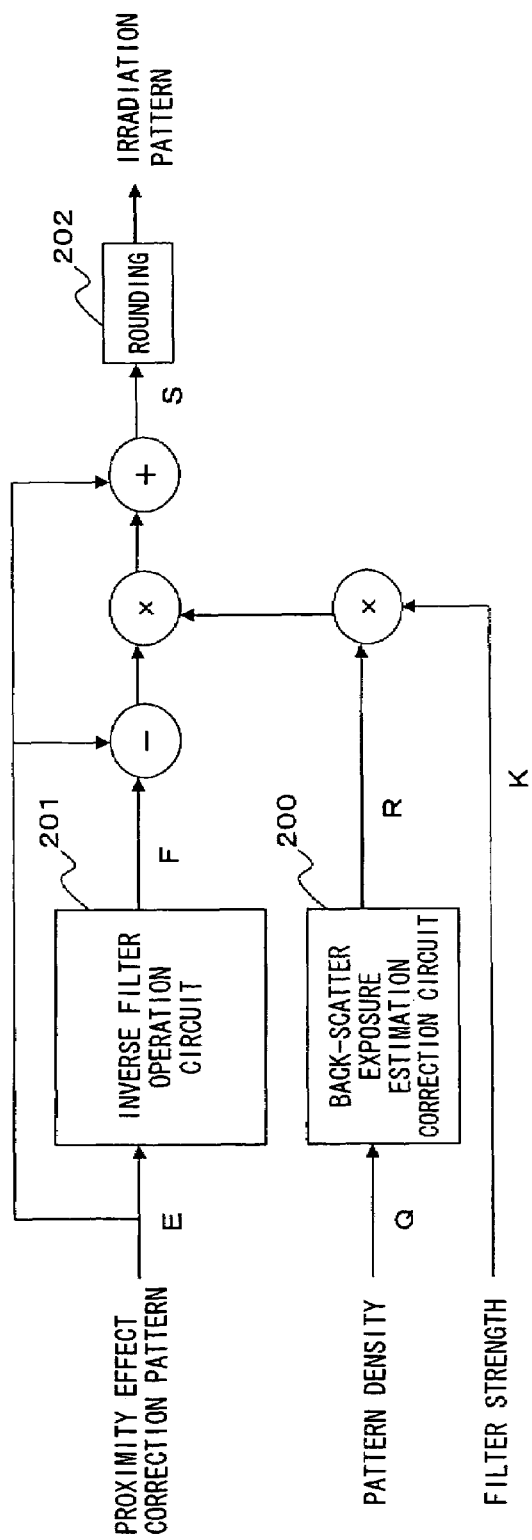
FIG. 16 is a block diagram showing a configuration of a filtering section.

FIG. 16 shows a configuration of the filtering section 104. The proximity effect corrected pattern E from the proximity effect correction section 103 is inputted to an inverse filter operation circuit 201. Thereafter, filtering is performed on the pattern E by the inverse filter operation circuit 201 to obtain a filtering result F. The filtering result F is obtained by using a difference from the proximity effect corrected pattern E to extract a portion changed by the filtering and by multiplying the above-described dose R of electron beams to be added, which is obtained by the back-scatter exposure estimation correction circuit 200, by a filter intensity K that is a constant value given by the central control section 106. Furthermore, the result is added again to the proximity effect corrected pattern E. Thus, a result of the filtering by the filtering section 104 is obtained. Just to be sure, rounding 202 for rounding a negative value to 0 is performed at the last stage of the method to obtain an irradiation pattern.

Here, for simplifying the description, the back-scatter exposure estimation correction circuit 200 was included in the proximity effect correction section 103 and the filtering section 104. As a matter of course, a series of the functions of the above-mentioned circuits can be realized by one circuit. Moreover, it is actually possible to reduce the hardware by transforming an operational expression, thus combining the proximity effect correction section 103 and the filtering section 104 into one single module.

Figure 17:
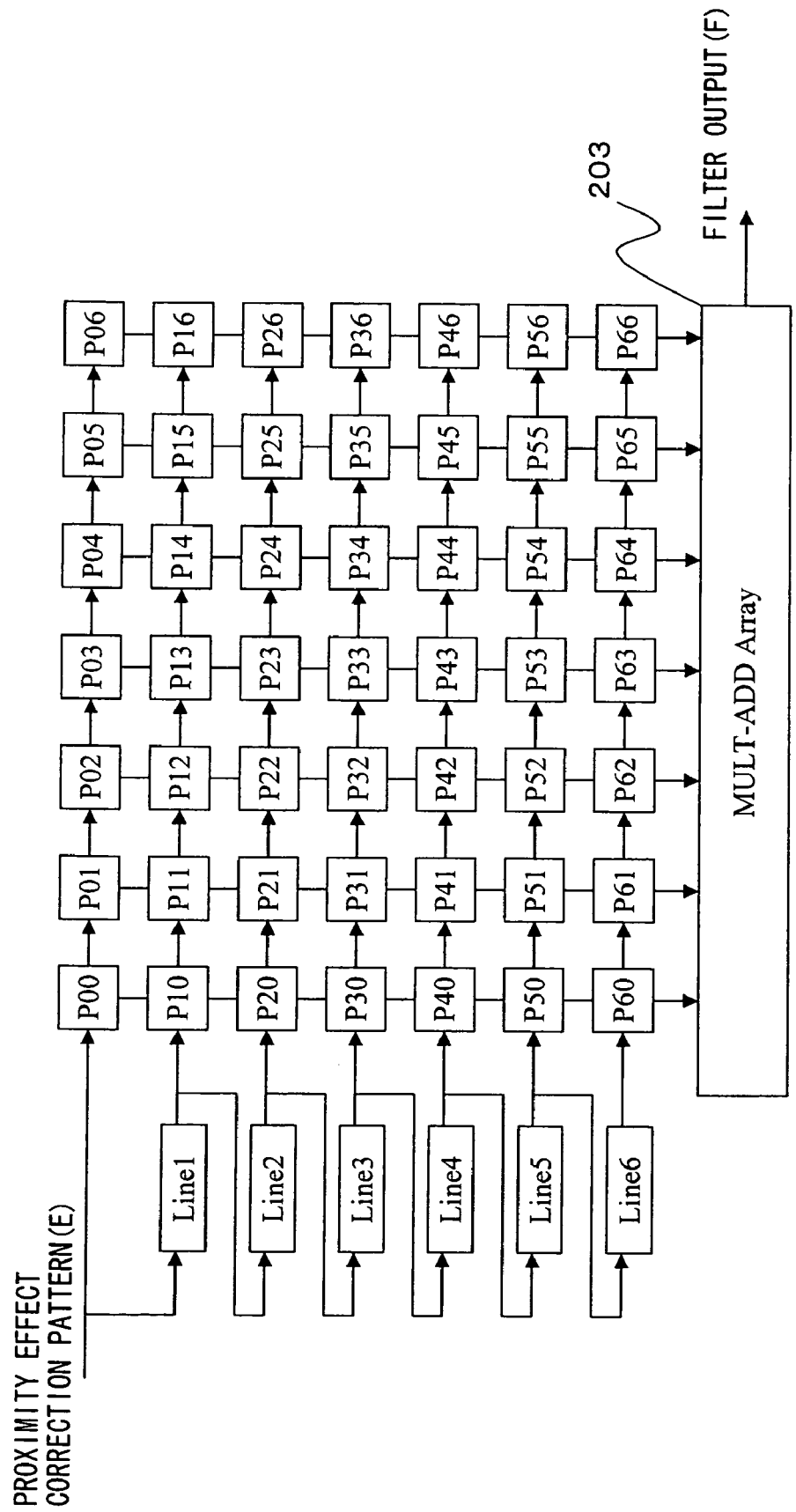
FIG. 17 is a block diagram showing a configuration of an inverse filter operation circuit.
Figure 18:
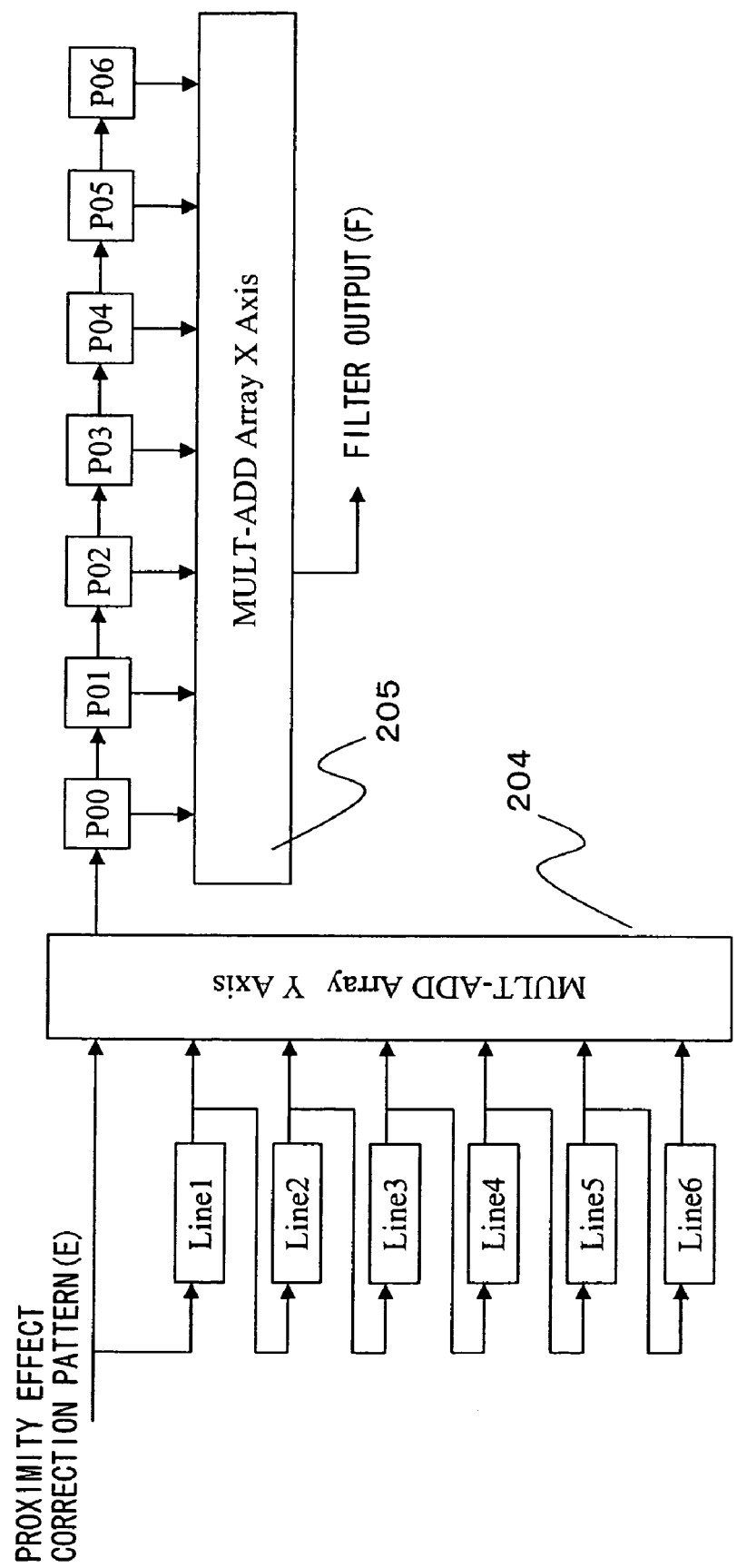
FIG. 18 is a block diagram showing a configuration which realizes the inverse filter operation circuit by use of simple and little hardware of a linear separation type.

Next, a method of realizing the inverse filter operation circuit 201 is shown in FIGS. 17 and 18. FIG. 17 shows a configuration of a general 7×7 two-dimensional filter. The inputted proximity effect corrected pattern E is stored in shift resistors sequentially from P00 to P06 of horizontal pixels. Moreover, the proximity effect corrected pattern E is stored in line buffers sequentially from Line1 to Line6. Thereafter, outputs from the line buffers are stored in shift resistors, while respectively being delayed by 1 line, sequentially from P10 to P16 and, in the same manner, sequentially from P60 to P66. As to the outputs, a filter coefficient integrator/adder 203 multiplies corresponding elements of the outputs by the previously obtained coefficient as shown in FIG. 14. Thus, a filter output F is outputted through a pipeline. If N of the registers are further added subsequent to the last stage from P06 to P66 of the shift registers and N of the filter coefficient integrators/adders 203 are added, the filter output can be efficiently obtained in parallel for N+1. In the case of N=3 and thus 4 rows, the circuit can be realized just by adding 21 registers and 49×3 multipliers (actually, the filter coefficient is laterally and vertically symmetrical, and the multipliers can be significantly reduced) and adders.

Moreover, as another method for realizing the inverse filter operation circuit 201, a method as shown in FIG. 18 of linearly separating a filter by horizontal and vertical components is used. Thus, the circuit can be realized with little hardware. Specifically, the inputted proximity effect corrected pattern is stored in line buffers sequentially from Line1 to Line6, and a filter of a pixel array arranged in a vertical direction is applied thereto by a vertical filter coefficient integrator/adder 204. The outputs from the vertical filter coefficient integrator/adder 204 are stored in shift registers sequentially from P00 to P06. Similarly, filtering in a horizontal direction is performed thereon by a horizontal filter coefficient integrator/adder 205. Here, as the filter coefficients multiplied by the vertical filter coefficient integrator/adder 204 and the horizontal filter coefficient integrator/adder 205, for example, a one-dimensional inverse filter coefficient as shown in FIG. 13 can be used. The processing method for linearly separating the inverse filter of the Gaussian distribution as described above cannot be realized in principle. However, the method is considered to be applicable in the case where a pattern to be drawn is formed of vertical and horizontal components. Moreover, good results have been obtained in experiments. As in the case of the configuration shown in FIG. 17, parallel processing can also be realized efficiently with little hardware.

Figure 19:
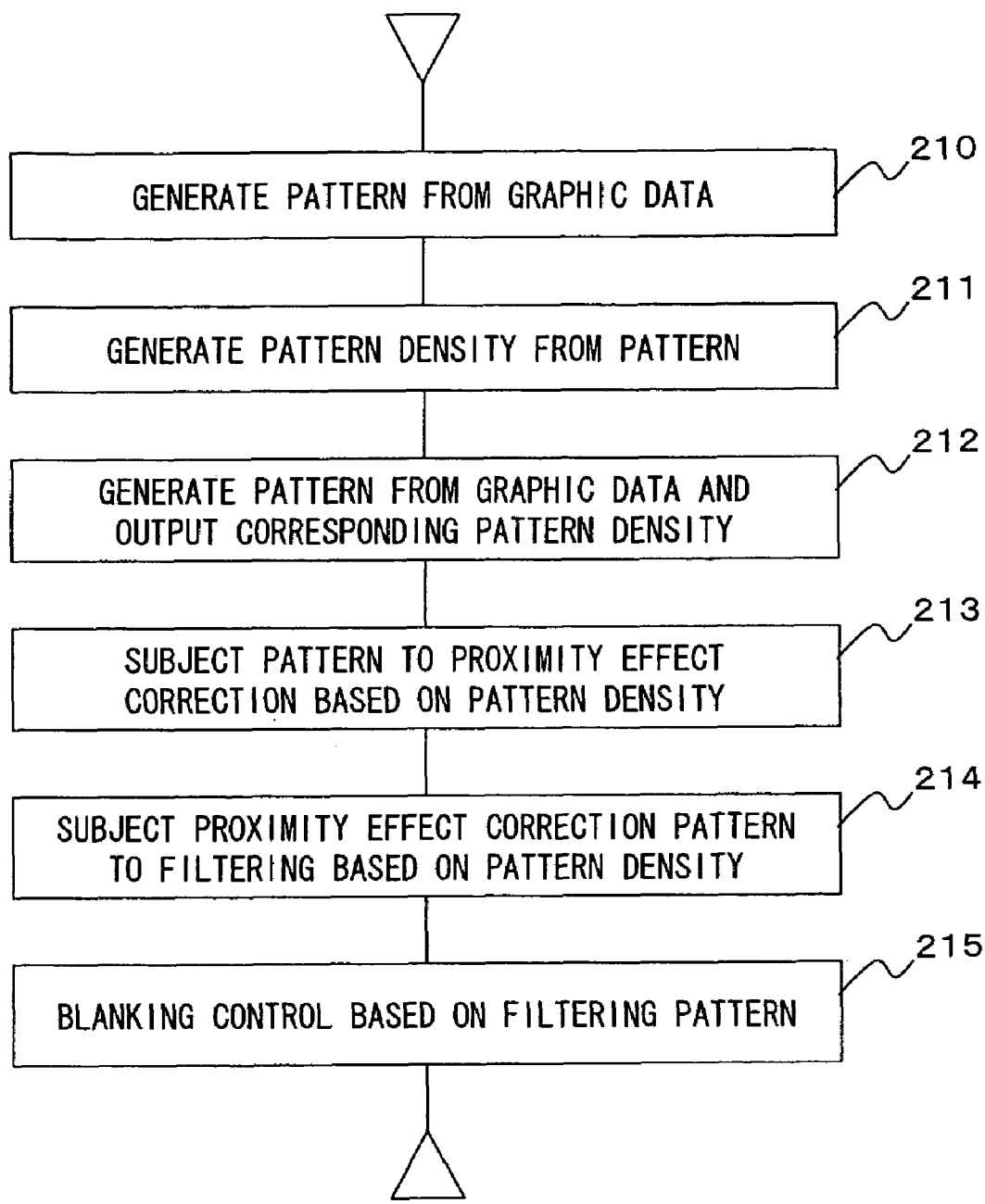
FIG. 19 is a flowchart showing a flow of processing by an overall controller.

Next, with reference to FIG. 19, a flow of processing executed by the central control section 106 will be described. First, graphic data are prepared by a system (so-called CAD system) for designing an integrated circuit to be previously prepared, and are stored in the graphic data storage section 101. In Step 210, the central control section 106 allows the pattern generation section 102 to read out the data from the graphic data storage section 101 and to convert the data into a pattern. Moreover, in Step 211, the central control section 106 allows the pattern generation section 102 to convert the generated pattern into a pattern density and to store the pattern density in the pattern density storage section 100. The above step so far described is the processing of generating the pattern density from the graphic data, which can also be executed by the system for designing the integrated circuit in advance.

Next, in Step 212, the central control section 106 allows the pattern generation section 102 to read out the data again from the graphic data storage section 101 and to convert the data into the pattern, and also allows the proximity effect correction section 103 to read out data on corresponding pattern density. Thereafter, in Step 213, the proximity effect correction section 103 is instructed to subject the pattern data generated by the pattern generation section 102 to proximity effect correction processing, based on the data read out from the pattern density storage section 100. Subsequently, in Step 214, the filtering section 104 is instructed to subject the pattern data corrected by the proximity effect correction section 103 to filtering, based on the data read out from the pattern density storage section 100 by the pattern generation section 102. Then, in Step 215, after a certain amount of the pattern data which has been subjected to the filtering and to be subjected to irradiation are stored in a rearrangement buffer of the blanking control section 105, an instruction is given, that the buffer is read out and a control signal is sent to the blanker 123. At the same time, the deflection control section 107 and the stage control section 108 are controlled so as to set a pixel under blanking control at the same position as the electron beam irradiated onto the wafer 128.

In the case of using the apparatus described in this embodiment, a series of steps from Steps 212 to 215 can be performed in parallel in a pipeline manner, thus realizing high-speed processing. Moreover, a part of or most of Steps 210 to 215 can be performed by using software. Thus, by following the flow shown in FIG. 19, a desired pattern can be drawn on the wafer 128.

Figure 20:
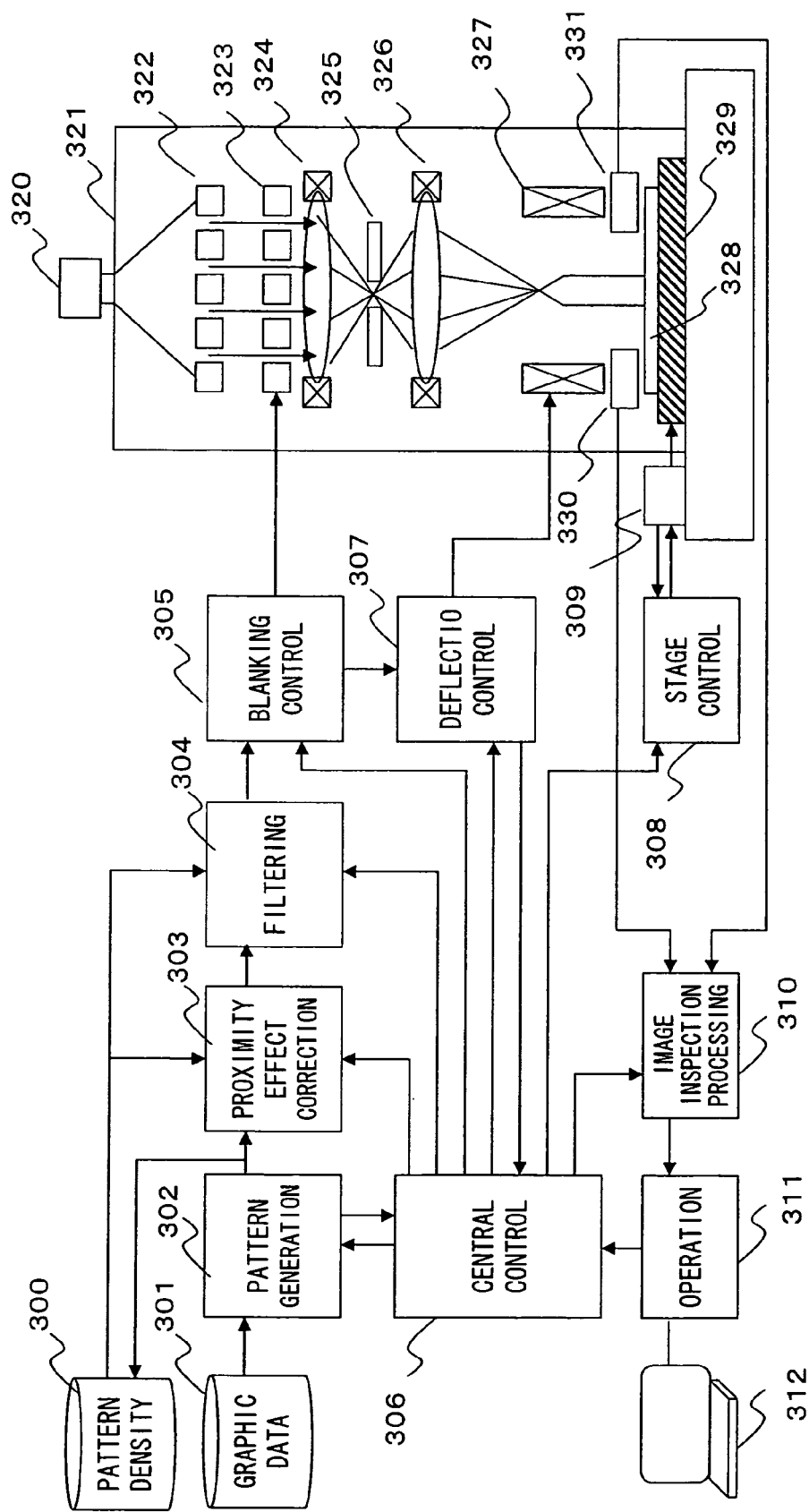
FIG. 20 is a block diagram showing an entire configuration of an electron beam apparatus according to a second embodiment.

Next, with reference to FIGS. 20 to 26, description will be given of an electron beam apparatus according to a second embodiment of the present invention, which irradiates a wafer with electron beams, and which detects a drawn graphic pattern by measuring secondary electrons emitted by the irradiation. FIG. 20 is a block diagram showing an example of an entire configuration of the electron beam apparatus. The electron beam apparatus includes a column 321, which is provided therein with: an electron gun 320 which emits an electron beam; apertures 322 which form the electron beam into a plurality of finely focused spot electron beams; a blanker 323 which controls the determination whether the plurality of electron beams should travel straight or should be deflected, according to a signal from a blanking control section 305; an electron lens 324 which focuses the electron beams which have been passed through the blanker 323; a plate 325 provided with small holes which allow only the electron beams traveling straight through the blanker 323 to pass through the holes and do not allow the electron beams deflected by the blanker 323 to pass; an electron lens 326 which focuses the electron beams onto a wafer 328 to form an image thereon; a deflector 327 which deflects the electron beams toward a given position within a given range on the wafer 328 under control of a deflection control section 307; a stage 329 which supports the wafer 328; and one or more detectors 330 and 331 which measure an amount of sample signals such as the secondary electrons emitted from the surface of the wafer 328.

A graphic data storage section 301 stores graphics, such as a rectangle and a polygon, which represent a pattern of an integrated circuit prepared to be drawn on the wafer 328, and information on the position and size of the pattern. A pattern generation section 302 converts graphic data inputted from the graphic data storage section 301 into bit map pattern data using, as a pixel value, a proportion of pixels in the data when the data is expanded at each of lattice points into which the wafer 328 is divided in a lattice form. A pattern density storage section 300 stores as a pattern density the sum of pixel values of the pattern within each of predetermined regions on the wafer 328, into which the wafer 328 is divided. A proximity effect correction section 303 outputs the pattern data directly to a filtering section 304. The filtering section 304 functions as a filter, which extracts the edge portion of the pattern from the pattern data passed through the proximity effect correction section 303, and which thus extracts a vicinity of an edge portion of the pattern by applying a smoothing filter thereto. The blanking control section 305 buffers the pixel value indicating the vicinity of the edge portion of the pattern, which is obtained by the filtering section 304, and controls the blanker 323 to allow the electron beams to pass through the blanker 323 within a time period indicated by the pixel value. A central control section 306 initializes the overall system, sets parameters, and issues operation instructions. The deflection control section 307 controls the deflector 327 so as to irradiate the electron beam emitted by the electron gun 320 onto a given position within a given range of the wafer 328. A stage control section 308 controls an actuator which actuates the stage 329 and a position sensor 309 so that the electron beam emitted by the electron gun 320 is irradiated onto the given position on the wafer 328. An image inspection processing section 310 takes sample signal data such as the secondary electrons from the detectors 330 and 331, forms an image based on a timing signal from the central control section 306, and performs image processing for inspecting the image, such as smoothing, differentiation and integration of the image. According to instructions given by an operator using an operation terminal 312, an operation section 311 performs processing of getting the central control section to start inspection and of taking and displaying the image subjected to the image processing in the image inspection processing section.

Figure 21:
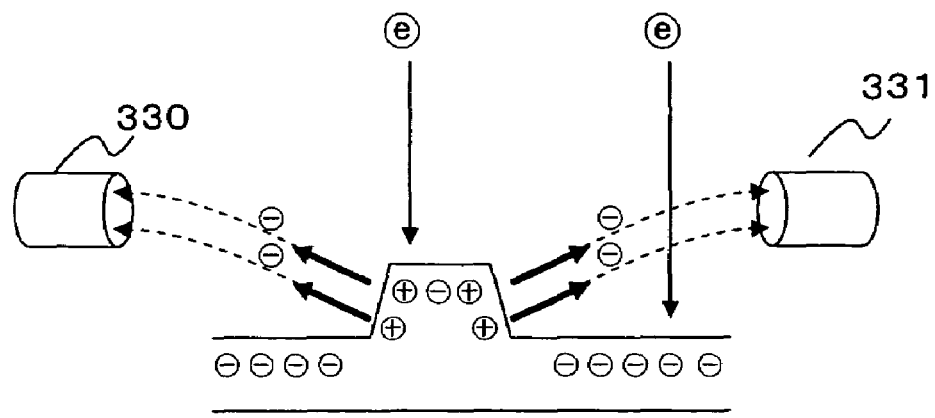
FIG. 21 is a view showing secondary electron emission caused by electron beam irradiation.

Next, with reference to FIG. 21, description will be given of a relationship between electron beams irradiated onto a wafer and secondary electrons. There is a known phenomenon, that, when finely focused electron beams are irradiated onto a sample such as a wafer, secondary electrons are emitted in a state where an angle formed by the secondary electrons and the electron beam is in inverse proportion to a cosine. Specifically, a small amount of secondary electrons are emitted from a flat portion on the surface of the sample, and secondary electrons exceeding the irradiated electrons are emitted from a portion having an irregular surface. The detectors 330 and 331 collect the secondary electrons emitted by a high positive potential, amplify the secondary electrons by using a scintillator or a photomultiplier tube, and output the amount of the secondary electrons as an analog signal. It is also possible to collect the secondary electrons by use of one detector. As shown in FIG. 21, the use of a plurality of detectors makes it possible to also acquire information on a pattern shape thereof.

As described above, the wafer surface has a portion where many secondary electrons are emitted relative to the irradiated electrons and a portion where a small amount of secondary electrons are emitted. The portion where many secondary electrons are emitted is positively charged, and the portion where a small amount of secondary electrons are emitted is negatively charged. The negative electrification changes the surrounding potential to negative and thus lowers an acceleration of the irradiated electrons and also affects the amount of secondary electrons emitted. Moreover, irradiation of electron beams causes a current to flow through the sample, and heat is generated to cause expansion. Thus, inspection accuracy may be impaired. In the second embodiment of the present invention, many electron beams are irradiated onto a portion including data on a drawn semiconductor pattern to be inspected, and a small amount of electron beams are irradiated onto a flat portion including no pattern. For example, in the case of measuring a line width of a wiring pattern or a gate width, it is only necessary to measure a shape of an edge portion of the pattern. Thus, it is not required to irradiate electron beams on other regions. Moreover, in inspection of whether or not the drawn semiconductor pattern has a defect, for example, in the case of inspection of short-circuiting of wiring, defects and the like, inspection focusing on only the edge of the pattern may be performed.

Figure 22:
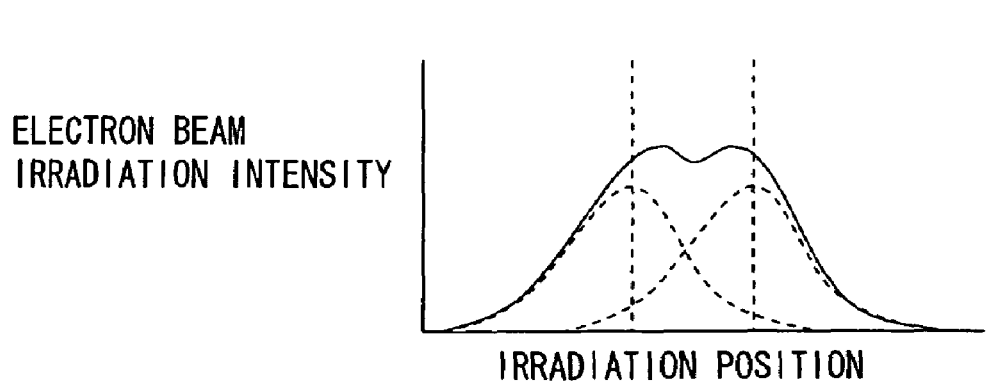
FIG. 22 is a schematic diagram showing a state where more electron beams are irradiated in an area around an edge.
Figure 23:
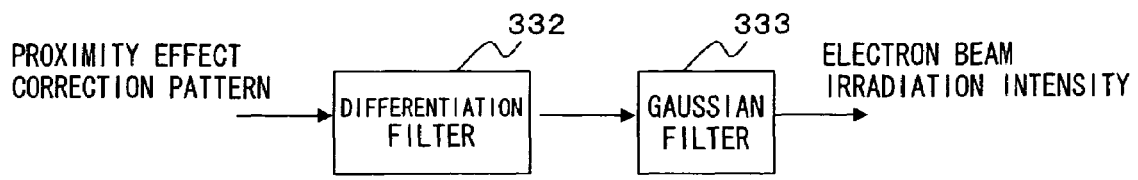
FIG. 23 is a block diagram showing a configuration of a filtering section which extracts a peripheral region of the edge.

In the present invention, the edge of the pattern is obtained from the graphic data drawn, and many electron beams are irradiated on a vicinity of the edge. FIG. 22 is a schematic diagram showing the above condition. When the pattern has edges at two positions indicated by dotted vertical lines, irradiation intensity of electron beams is determined as indicated by a solid curve obtained by adding smooth curves around the edges indicated by dotted curves, and the electron beams are irradiated onto the sample. Thus, the foregoing object can be achieved. FIG. 23 shows a configuration of the filtering section 304 which obtains the irradiation intensity of electron beams. For the pattern data from the proximity effect correction section, first, an edge portion of the pattern is detected by a differentiation filter 332. Next, in order to obtain a peripheral region of the edge portion, processing using a Gaussian filter, that is smoothing processing, is performed. Since input data is image data without noise, which is obtained by only expanding the graphic data into a bit map, the differentiation filter 332 can be realized by a simple 2×2 filter. Moreover, as to the Gaussian filter, the filter coefficients shown in FIG. 18 may be set in the Gaussian distribution.

Here, the pattern of the drawn graphic data was generated by the pattern generation section 302 from the drawn graphic data stored in the graphic data storage section 301. However, it is also possible to use an image of secondary electrons previously obtained by irradiating a given amount of electron beams. The object of this embodiment is to reduce the effect of electrification and the like by reducing irradiation of electron beams as much as possible in the portion including no pattern. By use of a method for previously observing the surface of the sample at low magnification and observing in detail the region to be inspected at high magnification based on the above observation, the dose of electron beams is increased compared with the case where the edge of the pattern is obtained from the drawn graphic data. However, compared with the case where all inspections are performed by using a fixed dose of electron beams, the dose of electron beams is reduced. The previously obtained image of secondary electrons is prepared by the image inspection processing section 310 and is sent to the graphic data storage section 301 through the operation section 311 (by using an unillustrated signal line). In this event, the pattern generation section 302 outputs the image of secondary electrons previously obtained by irradiating a fixed amount of electron beams, which is stored in the graphic data storage section 301, as it is, directly to the proximity effect correction section 303. The proximity effect correction section 303 also outputs input data as it is. Thus, the filtering section 304 can obtain the region around the edge of the pattern drawn on the sample by use of the image of secondary electrons.

Figure 24:
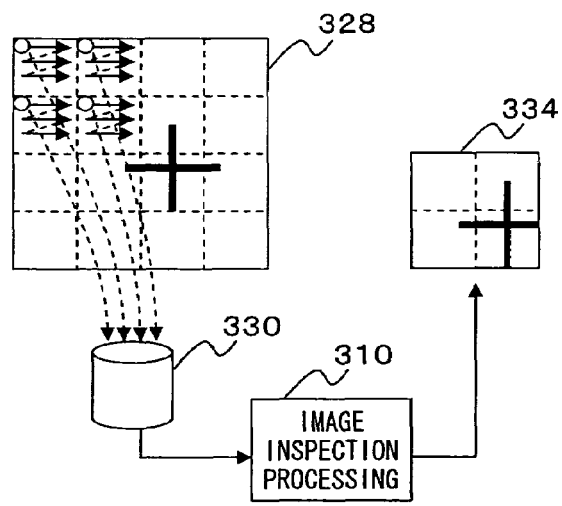
FIG. 24 is a diagram showing a multiple image obtained by irradiation of a plurality of electron beams.

Next, description will be given of a method for performing inspection on a wafer and the like by use of a plurality of finely focused electron beams. In the electron beam apparatus shown in FIG. 20, a plurality of electron beams are irradiated at intervals of several micrometers to several tens of micrometers on the wafer 328. The detectors 330 and 331 are structurally distant, by several centimeters, from the spot to be irradiated with the electron beams on the wafer 328. Specifically, it is impossible to separate secondary electrons corresponding to the plurality of electron beams and to separately detect the secondary electrons. Therefore, in the present invention, as shown in FIG. 24, the secondary electrons corresponding to irradiation of the plurality of electron beams are collectively received by the detector 330. Although, for simplicity, FIG. 24 shows one detector, substantially the same effect is achieved even if a plurality of detectors are provided to detect directional components as shown in FIG. 21.

In the case where, for example, four electron beams are irradiated onto the wafer 328 as shown in FIG. 24, secondary electrons emitted corresponding to the respective electron beams are collected by the detector 330, and the amount of the secondary electrons is measured. Scanning of the irradiated electron beams is performed at intervals between the electron beams as indicated by arrows in FIG. 24. After the scanning of the region is finished, scanning is performed on another region. If secondary electron data obtained by the detector 330 is reconfigured into an image by the image inspection processing section 310, the image obtained becomes like a multi-image 334. Specifically, the upper left portion of the multi-image 334 is formed by overlapping images of the secondary electrons obtained by the four electron beams. In FIG. 24, the cross pattern on the wafer 328 is folded at its right end in the multi-image 334.

In the image inspection processing, a line width of a wiring pattern and a diameter of a contact hole are measured from the obtained image. Moreover, processing of detecting defects such as short-circuiting and loss of wiring is performed. Besides the above, as preprocessing, processing of calculating a histogram of the obtained image is performed for brightness adjustment, and processing of dispersing derivative values of the image is performed for focus adjustment. Among the above processings, as to the processings of detecting defects, calculating the histogram, dispersing the derivative values, and the like, the target processings can be performed even if many images are overlapped with each other. For example, in the case of detecting defects, a defect resulting in deformation of a semiconductor pattern can be detected by comparing an image obtained by overlapping images, such as the previously obtained image, with the image of secondary electrons obtained by the detector 330. By carrying out inspection without performing the above-described irradiation of the electron beams only in the portion around the edge of the pattern, even a defect generated in a flat region including no pattern can be detected. Moreover, the brightness adjustment and the focus adjustment have no problem even if images appear to overlap with each other, and thus can be performed by using the multi-image 334. Specifically, most of the processings by the image inspection processing section can be executed by use of a plurality of electron beams at high speed in proportion to the number thereof.

Figure 25:
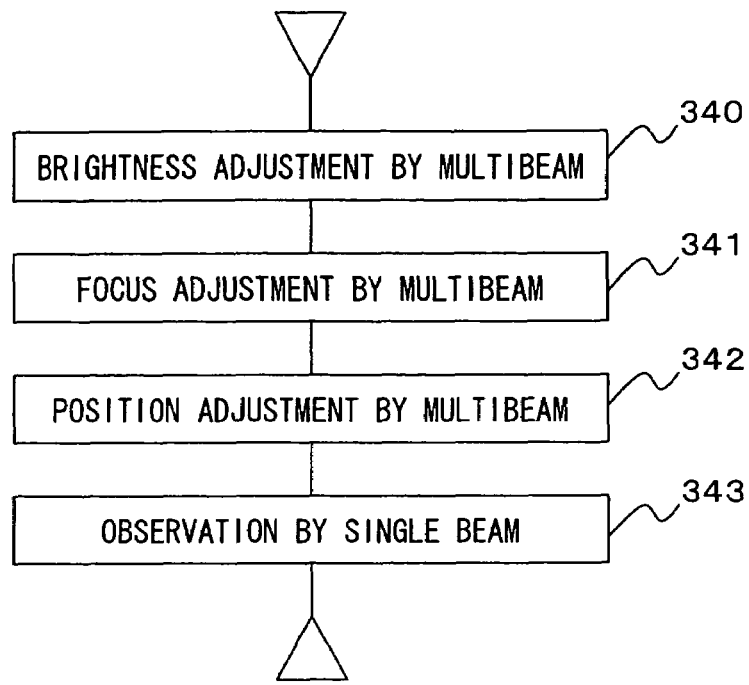
FIG. 25 is a flowchart showing a processing flow according to the second embodiment.

Next, with reference to FIG. 25, description will be given of a flow of processing executed by the operation section 311. First, in Step 340, a position of a wafer to be inspected is aligned with a position of electron beam irradiation. Moreover, a plurality of electron beams are irradiated to obtain an image of secondary electrons, and a histogram is obtained. Thereafter, based on the result, sensitivity of the detector 330 is adjusted. Next, in Step 341, the following processing is performed. Specifically, a plurality of images of secondary electrons are obtained while changing a voltage of the electron lens 326. Thereafter, dispersion of derivative values of the respective images is obtained, and a voltage, at which the dispersion is maximized and the electron lens 326 is optimally focused, is obtained and set. In Step 342, a region to be inspected on the wafer is observed at low magnification to obtain an accurate position of the inspection target. This is performed for accurately observing the wafer on the roughly moved stage. Since the obtained images of secondary electrons are multiplexed by the number of electron beams, matching is performed by preparing a previously multiplexed image also in the case of detecting the position. Moreover, since the graphic data cannot be used in this event, inspection is performed without using the function of irradiating electron beams only around the edge. Next, in Step 343, by using only one electron beam, inspection by typical raster scanning is performed. As described above, in the case where the inspection can be performed by using the plurality of electron beams, the image inspection processing is performed at high speed by using the plurality of electron beams.

Next, a third embodiment of the present invention will be described. In the configuration of the electron beam apparatus according to the second embodiment of the present invention, which was described with reference to FIG. 20, the detectors 330 and 331, the image inspection processing section 310, the operation section 311 and the operation terminal 312 are added into the electron beam apparatus according to the first embodiment of the present invention, which is shown in FIG.

1, and the configurations of the proximity effect correction section 303 and the filtering section 304 are further changed. By allowing the proximity effect correction section 303 and the filtering section 304 shown in FIG. 20 to have the functions of the proximity effect correction section 103 and the filtering section 104 shown in FIG. 1, the electron beam apparatus shown in FIG. 20 can also be used as a multiple-beam type electron beam apparatus which draws a graphic pattern by use of a plurality of electron beams. Moreover, an acceleration voltage of the electron beams is several tens of thousands of volts in the electron beam apparatus for drawing graphic patterns and is 1000 volts or less in the electron beam apparatus using electron beams for inspection. Thus, means for adjusting the voltage is added into the apparatus. As the most effective use of the above electron beam apparatus, the following method is adopted. Specifically, a mark for detecting a position on a resist-coated wafer is measured by a detection function using secondary electron images. Thereafter, an accurate position of the wafer is obtained, and a graphic pattern is drawn based on the position of the wafer.

Figure 26:
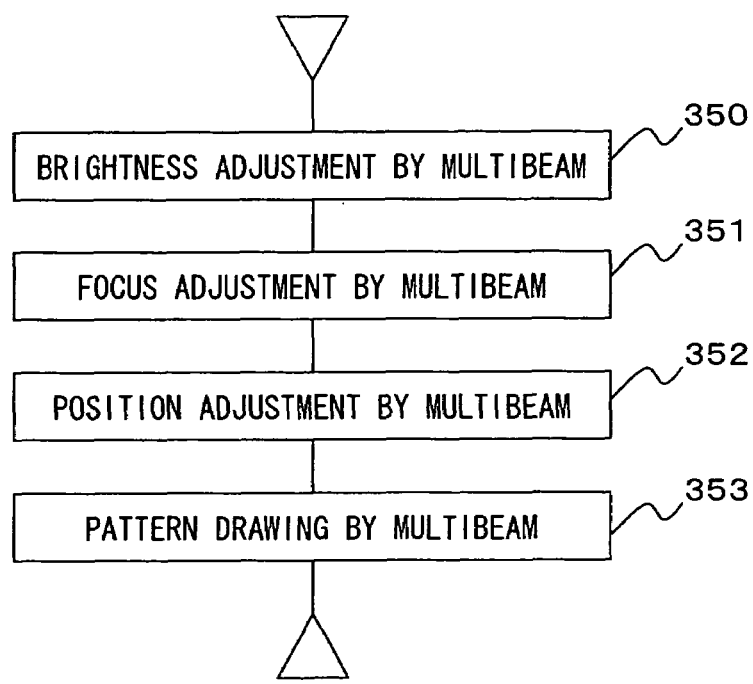
FIG. 26 is a flowchart showing a processing flow according to a third embodiment.

A flow of processing by the operation section 311 in this event will be described with reference to FIG. 26. First, in Step 350, a position of a mark provided on the wafer for detecting a position is aligned with a position of electron beam irradiation. Moreover, a plurality of electron beams are irradiated to obtain an image of secondary electrons, and a histogram is obtained. Thereafter, based on the result, sensitivity of the detector 330 is adjusted. Next, in Step 351, the following processing is performed. Specifically, a plurality of images of secondary electron are obtained while changing a voltage of the electron lens 326. Thereafter, dispersion of derivative values of the respective images is obtained, and a voltage at which the dispersion is maximized and the electron lens 326 is optimally focused is obtained and set. In Step 352, a region to be inspected on the wafer is observed to obtain an accurate position of the inspection target. This is performed for accurately measuring the position of the wafer on the roughly moved stage. Since the obtained secondary electron images are multiplexed by the number of electron beams, matching is performed by preparing a previously multiplexed image also in the case of detecting the position. Moreover, since the graphic data cannot be used in this event, inspection is performed without using the function of irradiating electron beams only around the edge. Next, in Step 353, processing of drawing a graphic pattern by using the plurality of electron beams, as shown in FIG. 19, is performed.

As described above, according to the first embodiment of the present invention, by applying an inverse filter of exposure characteristics of electron beams, high-contrast exposure can be performed even with a small dose of electron beams. Thus, a pattern can be drawn by use of highly accurate electron beams with high throughput. Moreover, since alignment can be easily increased for a filter circuit, high-speed processing performance can be achieved. Thus, system throughput can be improved.

Moreover, according to the second embodiment of the present invention, since a small amount of electron beams are irradiated on the region other than the region around the edge of the drawn pattern, negative electrification is suppressed. Accordingly, measurement accuracy can be improved. Moreover, by providing the image inspection processing section which processes the secondary electron images obtained by irradiating a plurality of electron beams, inspection of the wafer can be performed at high speed.

Furthermore, according to the third embodiment of the present invention, the same apparatus can be used to perform drawing of graphic data using a plurality of electron beams and wafer inspection using electron beams. Thus, installation costs for the apparatus can be reduced.

In the above embodiments, the description was given of the electron beam apparatus which forms a semiconductor integrated circuit on a wafer by use of electron beams, and the method for generating an electron beam irradiation pattern. Meanwhile, besides the semiconductor integrated circuit, the present invention is also applicable to, for example, pattern formation of a hard-disk read head, and an apparatus for forming or inspecting a minute pattern using electron beams, such as recording of data on an optical storage medium including a DVD-ROM and the like.

What is claimed is:

1. An electron beam apparatus which draws a pattern by performing raster scan of finely focused electron beams on a sample, comprising:
   means for retaining drawing pattern data including a plurality of graphics as a bit map formed of pixels;
   means for calculating a drawing pattern density based on the bit map;
   means for correcting the bit map according to the drawing pattern density by adding a large additive correction amount to a value of each of the pixels included in the bit map in a region where the drawing pattern density is low and by adding a small additive correction amount thereto in a region where the drawing pattern density is high; and
   means for controlling a dose of electron beams according to the value of each pixel in the corrected bit map.

2. The electron beam apparatus according to claim 1, further comprising:
   means for subjecting the data in the corrected bit map to filtering for sharpening, within a range in which the value of each pixel in the corrected bit map does not take on a negative value.

3. The electron beam apparatus according to claim 2, wherein, in the filtering for sharpening, blur of the finely focused electron beams is approximated by a Gaussian filter, and a high-pass filter having an inverse characteristic of the Gaussian filter is used.

4. The electron beam apparatus according to claim 1, wherein a plurality of the finely focused electron beams are raster scanned at the same time.

5. An electron beam irradiation pattern generation method for drawing a pattern by raster scanning finely focused electron beams on a sample, comprising the steps of:
   converting drawing pattern data including a plurality of graphics into a bit map formed of pixels;
   calculating a drawing pattern density based on the bit map;
   correcting the bit map according to the drawing pattern density by adding a large additive correction amount to a value of each of the pixels included in the bit map in a region where the drawing pattern density is low and by adding a small additive correction amount thereto in a region where the drawing pattern density is high; and
   obtaining an electron beam dose by performing filtering for sharpening within a range in which the value of each pixel in the corrected bit map does not take on a negative value.

6. An electron beam apparatus having a function of drawing an arbitrary graphic pattern by irradiating finely focused electron beam onto a sample, and a function of detecting a sample signal emitted from the sample by irradiating the finely focused electron beams onto the sample and of observing a shape of a sample surface, comprising:
   means for converting drawing pattern data including a plurality of graphics into a bit map formed of pixels;

means for calculating a drawing pattern density based on the bit map;

means for correcting the bit map according to the drawing pattern density by adding a large additive correction amount to a value of each of the pixels included in the bit map in a region where the drawing pattern density is low and by adding a small additive correction amount thereto in a region where the drawing pattern density is high;

means for controlling a dose of electron beams according to the value of each pixel in the corrected bit map;

means for selecting between irradiation of at least one electron beam and irradiation of a plurality of electron beams for the plurality of electron beams;

at least one detection means for detecting the sample signal; and means for performing image processing for an image obtained by the detection means, wherein the electron beams irradiated onto the sample are formed of a plurality of finely focused electron beams.

* * * * *